United States Patent [19]

Matsumoto

[11] Patent Number: 5,090,120

[45] Date of Patent: Feb. 25, 1992

[54] PROCESS FOR FORMING SOLDER LANDS IN A PRINTED WIRING BOARD MANUFACTURING METHOD

[75] Inventor: Masuo Matsumoto, Saitama, Japan

[73] Assignee: Nippon CMK Corp., Japan

[21] Appl. No.: 488,632

[22] Filed: Mar. 5, 1990

[30] Foreign Application Priority Data

Mar. 3, 1989 [JP] Japan ................................. 1-51594

[51] Int. Cl.⁵ .............................................. H05K 3/02
[52] U.S. Cl. ...................................... 29/846; 174/253; 174/256; 427/259
[58] Field of Search .................. 174/261, 253, 256; 427/259; 29/846

[56] References Cited

U.S. PATENT DOCUMENTS 4,767,892  8/1988  Kobari ........................... 29/846 X
4,779,339  10/1988  Ohtami et al. ....................... 29/846

Primary Examiner—Carl J. Arbes
Attorney, Agent, or Firm—Bruce L. Adams; Van C. Wilks

[57] ABSTRACT

A process of forming solder lands in a printed wiring board manufacturing method is disclosed. The process comprises a step of forming a wiring circuit of a required pattern by a copper foil provided on an electrical insulating sheet, a step of forming required solder resists on the wiring circuit, a preprinting step for leveling the surface of the wiring circuit and a step of printing required solder resist on the wiring circuit.

6 Claims, 2 Drawing Sheets

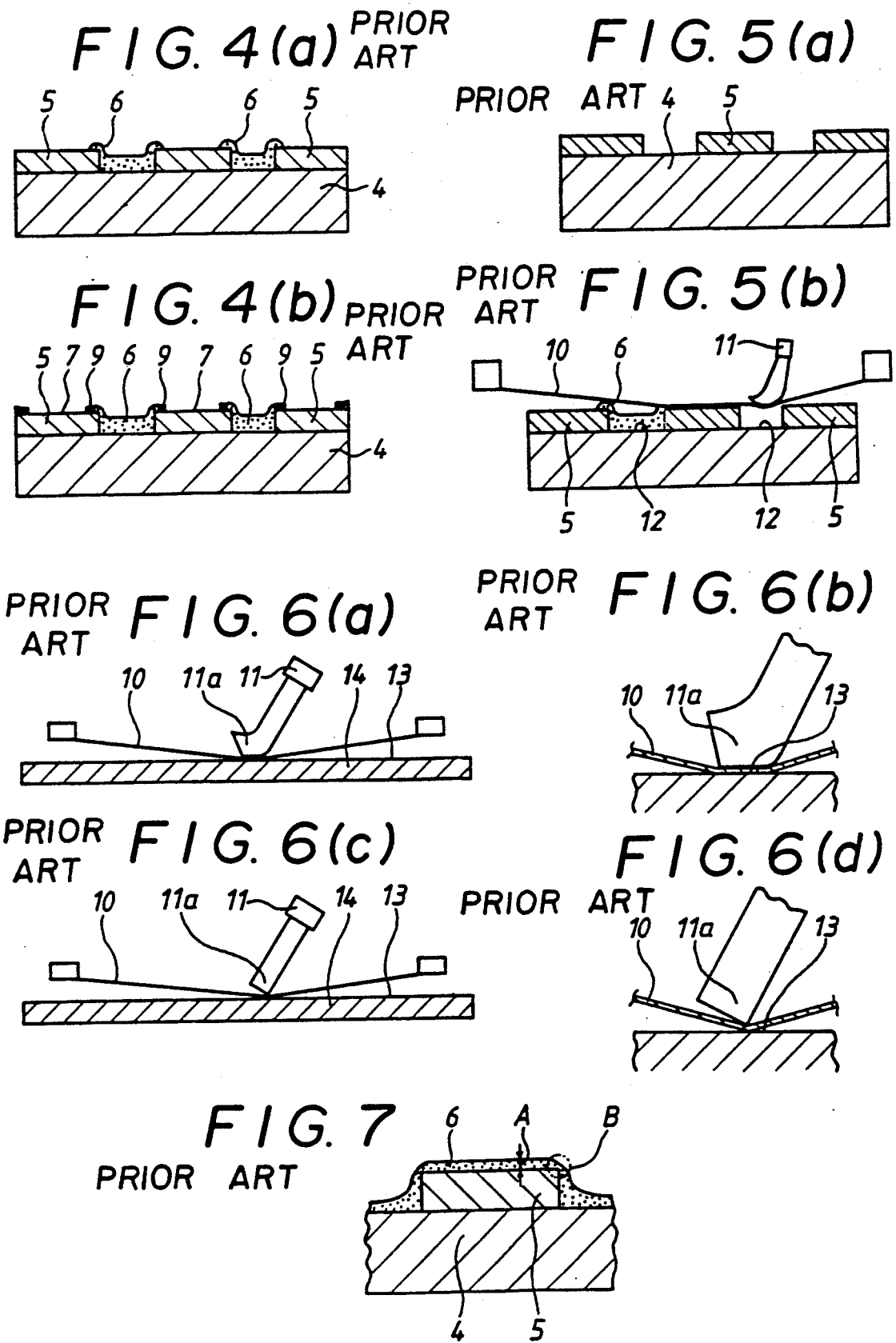

PROCESS FOR FORMING SOLDER LANDS IN A PRINTED WIRING BOARD MANUFACTURING METHOD

BACKGROUND OF THE INVENTION

The present invention relates to a process for forming solder lands in a printed wiring board manufacturing method.

In the case of loading and soldering electrical components onto a printed wiring board having a wiring circuit of a required pattern provided on an electrical insulating sheet, a solder resist process is carried out in order to prevent the solder from being adhered to an unnecessary portion of the wiring circuit, save and batch the solder, prevent short circuit caused by the solder bridge, form suitable solder fillet, and protect the lead wire of the wiring circuit from the external environments.

As a solder resist process a screen printing process and a photographic developing process are adopted. Generally, the screen printing process is apt to adopt in a non-through hole wiring board and the photographic developing process is apt to adopt in a through hole wiring board (including a multilayer printed wiring board, since the through hole wiring board has more fine circuits than that of non-through hole wiring board and thus a pattern of solder resist becomes fine so that it is obliged to adopt the photographic developing process which is advantageous to the fine solder resist pattern.

The photographic developing process is, however, deficient in mass production and becomes high in cost due to high source material so that a non-through hole wiring board which requires mass production and low cost, can not be adopted.

The solder resist by the screen printing process is carried out as shown in FIG. 2, after an etching step in the subtractive process (the etched foil process). That is, an etching resist 3 corresponding to a required pattern is applied (FIG. 2b) on a copper foil 2 of a copper clad laminate 1 which is subjected to a cutting and machining process shown in FIG. 2a, thereby forming an wiring circuit 5 of the required pattern on the electrical insulating sheet 4 by the required etching process (FIG. 2c).

A solder resist 6 shown in FIG. 2d is then, printed on the wiring circuit 5 shown in FIG. 2c through a required solder mask.

Since a conventional process for forming solder resists 6 has a limitation in precise formation of the solder resist followed to the fine circuit, in the case of performing the processing step shown in FIG. 2d, particularly, in the case of forming solder lands 7 of solder resists 6 as shown in FIGS. 3a and 3b, the solder land 7 is printed in accordance with the required solder mask diameter thereof in a first printing step, and then, a solder land 8 having a diameter slightly larger than the above solder mask diameter (for example, 0.1 mm to approximately 0.2 mm in diameter is printed in a second printing step, thereby finishing the whole surface thereof. Alternately, as shown in FIG. 4a, solder resist printing is carried out in a first printing step and a hemming or trimming 9 of a solder land portion of the solder resist 6 is carried out by character ink in a second printing step as shown in FIG. 4b. The printing steps shown in FIGS. 4a and 4b may be reversed.

In the process for forming solder resist in the printed wiring board manufacturing method, the following three requirements in printing technique are present.

(1) The copper foil portion of the wiring circuit to be coated by the solder resist should not be exposed in copper foil itself.

(2) In the solder land, a blur of the solder resist should be supressed and the area of the solder land should be secured in accordance with designed dimension.

(3) The film coated pressure of the solder resist must be guaranteed even with a lowest level.

In the case of performing the above requirements completely, however the above requirements (1) and (2) are mutually contradictory. This is a cause of limitation in fine solder land formation by the screen printing process.

In order to attain the first requirement, that is, as shown in FIG. 5a, during the manufacture step of printed wiring board and after etching, the presence of wiring circuit 5 must be taken into account that the printed surface of the solder resist 6 becomes uneven. As shown in FIG. 5b, in the case of printing the solder resist 6, when the solder resist 6 is printed onto the wiring circuit 5 by a squeegee 11 while using a screen 10, it is required that a printing pressure is applied to the squeegee 11, thereby flowing solder resist ink into recess portion 12.

In this case, in principle, the higher the printing pressure, the more the solder resist ink fills into the recess portion 12 and the lower the viscosity of the ink, the more the solder resist ink flows into the recess portion 12.

In order to suppress the blur of solder resist as the second requirement, then, the printing pressure of the squeegee 11 must be decreased as soon as possible.

As shown in FIG. 6a, that is, when the printing pressure of the squeege 11 is high, a tip portion 11a thereof is bent and the contact area of a printed surface 13 of the printed matter 14 and the off bent tip portion 11a of the squeegee 11 becomes large (see FIG. 6b), so that the snapping-off of a form plate becomes worse and thus the blur of solder resist is caused.

It is found from the silk screen printing that the printed-out portion of a screen 10 must be separated from the printed surface 13 as soon as possible, but in the case of large contact area of tip portion 11a of the squeegee 11, the screen 10 is separated from the printed surface 13 for a long time, and thus the snap-off of the form plate becomes worse.

This phenomenon is the same as the following phenomenon. When a stamp is used, if the stamp does not press its surface onto a paper at one time, but press the surface to the paper in the order, its front portion, its center portion and its back portion, and then separate its surface from the paper in the order, the front, the center and the back portion, stamping without blur may be obtained, while if the whole surface of the stamp is pressed onto the paper at any time, and it is subjected to a slight horizontal vibration (slight vibration accompanied with squeegee movement), the stamping with blur may be obtained.

Then, the lower printing pressure of the squeegee 11, the more suitable printing with supressed blur can be obtained, and thus the higher printing precision with high ink 11 viscosity can be obtained.

FIGS. 6c and 6d show a relation between the squeegee and the printed surface 13 in the case of low printing pressure of the squeegee 11.

As is found from the above descriptions, the condition in screen printing technique for the first requirement, that is, the complete coating of the copper foil portion required in the process of forming solder resist by the screen printing method, is as follows. It is preferable to make the printing pressure high and to make the viscosity of solder resist ink low. On the contrary, the condition in the screen printing technique for the second requirement, that is, the suppresion of the blur of the solder resist is as follows. It is preferable to make the printing pressure of the squeegee 11 low and to make the viscosity of solder resist ink high. One could not avoid performing the present screen printing method under the above inconsistent conditions at only 1~2 sec during which the squeegee 11 is moved.

Even though processes shown in FIGS. 3 and 4 are adopted in the case of following solder resist, fundamental unevenness in surface condition of the printed surface is not entirely changed and thus the presence of the above inconsistent relationship causes a technical limitation in mass production of the solder 7 having a diameter up to 1.4 mm in diameter in case of forming solder resist 6.

In this present guarantee in thickness of resist coating film described as the third technical requirement in the case of forming solder resist by the screen printing process, as shown in FIG. 7, the film thickness of coated solder resist 6 provided on the wiring circuit 5 comprises a portion A and a portion B, and the thickness of the portion B is about a half of that of the portion A, so that problem of moisture vapor resistance for the portion B arises in environmental test, and thus the guarantee in thickness of the resist film is also required for the portion B. This has an important problem for the leveling of the whole film thickness.

SUMMARY OF THE INVENTION

It is an object of the present invention to overcome the above described problem of the conventional solder land forming process.

It is another object of the present invention to provide a process for forming solder resist in the screen printing method, which is capable of forming a fine solder land in a high density wiring circuit.

According to the present invention, there is provided a step of forming a wiring circuit of a reqired pattern by a copper foil provided on an electrical insulating sheet and a step of forming required solder resists on the wiring circuit, the improvement comprising a preprinting step for leveling the surface of the wiring circuit and a step of printing required solder resist on the wiring circuit.

The preprinting step comprises means for filling solder resist ink into recess portions in the surface of the wiring circuit. The preprinting step comprises means for filling solder resist ink into recess portion in the surface of the wiring circuit through a mask screen corresponding to a pattern opposite to the pattern of the wiring circuit.

According to the process of forming solder resist of the present invention, in a printed wiring board manufacturing method, a wiring circuit of a required pattern is provided by a copper foil formed on an electrical insulating sheet, required solder resists are formed on the wiring circuit, the printed surface of the solder resist is leveled in a preprinting step, and the printing of the required solder resist is performed in such a manner that the printing pressure of the solder resist is suppressed in the minimum limit and the viscosity of the solder resist ink is increased in the maximum limit, thereby forming solder resist of fine pattern with high density and attaining a leveling effect of the film thickness.

BRIEF DESCRIPTION OF THE DRAWINGS

FIGS. 2a, 2b, 2c, 2d, FIGS. 3a, 3b, FIGS. 4a, 4b and FIGS. 5a, 5b are sectional views for explaining the conventional screen printing process, respectively, FIG. 6a, 6b, 6c and 6d are explanatory views for explaining printing pressure of the squeegee in the conventional screen printing process, and FIG. 7 is sectional view showing the film thickness of squeegee in the conventional screen printing process.

DETAILED EXPLANATION OF THE PREFERRED EMBODIMENTS

Now to the drawings, there is shown one embodiment of a process for forming a solder land according to the present invention.

Figure 1A:
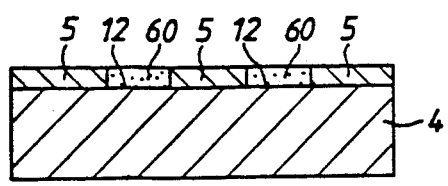
FIG. 1a is a fragmentary sectional view showing a preprinting step of solder resist in a process of forming solder land according to the present invention.
Figure 1B:
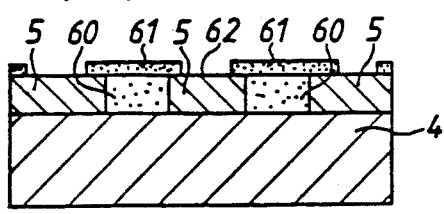
FIG. 1b is a fragmentary sectional view showing solder resist printing step in the process according to the present invention.

As shown in FIG. 1a, a copper clad laminate is subjected to a required cut machining process and to an etching process in accordance with a required pattern, thereby forming a wiring circuit 5 of the required pattern on an electrical insulating sheet or base material 4. This step may be carried out by the conventional well known process.

In the process of forming the required solder resist on the wiring circuit 5 after formation of such a printed wiring circuit, a solder resist screen corresponding to a pattern opposite to a circuit pattern for use in a formation of the wiring circuit 5 is formed and then a preprinting step for printing solder resist is carried out on the insulating sheet 4 after formation of the wiring circuit 5 by the above solder resist screen.

Such a preprinting step must be carried out in such a manner that as shown in FIG. 1a, in order to level the uneven surface of the insulating sheet 4 due to the wiring circuit 5, solder resist ink 60 is run or filled into a recess portion 12, while selecting the screen mesh and the viscosity of solder resist ink in such a manner that the copper film thickness of the solder resist ink is the same as the copper foil thickness.

Then, solder lands 62 may be formed by screen-printing the solder resist 61, through a solder mask screen (not shown) having a required pattern, on the flat surface made by filling the solder resist ink 60 into the recess portion 12 formed between the wiring circuits 5.

In the screen printing of the solder resist 61, in this case, it is not necessary to take the screen printing condition for uneven surface due to the wiring circuit 5 and the recess portion 12 into account so that the screen printing of the solder resist 61 may be carried out while selecting a suitable designing condition of only solder land 62.

That is, it is possible to form solder land 62 by the screen printing with suppressed printing pressure and with the use of solder resist ink having rather high viscosity.

Figure 2A:
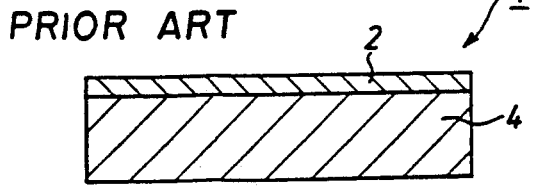
Figure 2B:
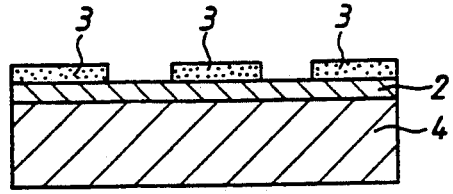
Figure 2C:
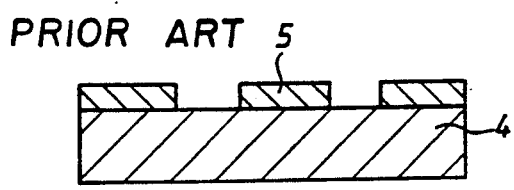
Figure 2D:
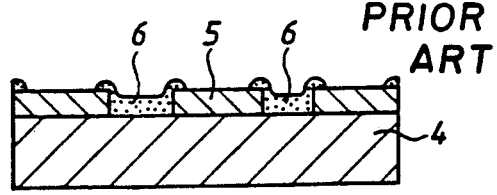

In other words, this means that it is possible to carry out the printing of the solder resist 61 by the same condition as that of screen printing of the etching resist 3 in the etching process shown in FIG. 2b. For example, in the screen printing of etching resist 3 shown in FIG. 2b, flat copper foil 2 is coated on the whole surface of the insulating sheet 4. In this case, the printing pressure of the pattern printing is an air pressure of 0.8 kg/cm$^2$ ~ 1.2 kg/cm$^2$. This printing pressure may be represented by a dimension extruding from the screen surface of the tip portion of the squeegee by some printer maker.

In the pattern printing of such an etching resist 3 a conductor distance of 0.01 mm may be obtained by mass production, and thus the pattern printing of fine solder resist 61 having the same dimension may be carried out. According to the present invention it is possible to form solder land 62 having 0.5 mm in diameter instead of current solder land of 1.4 mm in diameter.

The printing pressure of screen printing of the conventional solder resist is about 2.5 kg/cm$^2$ ~ 3.0 kg/cm$^2$. In the conventional screen printing, a problem of exposing the copper foil arises for less than the above printing pressure.

Figure 1C:
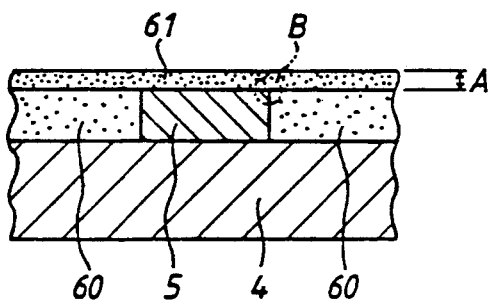
FIG. 1c is a fragmentary sectional view showing solder resist portions other than solder land in the process according to the present invention.
Figure 3A:
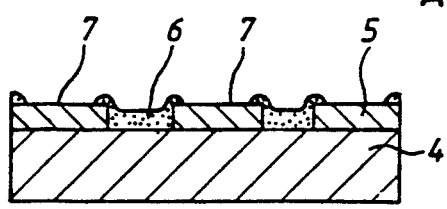
Figure 3B:
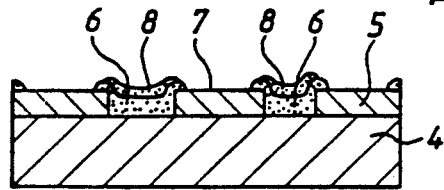

As is found from FIG. 1c, moreover, the film thickness of the solder resist 61 formed on the wiring circuit 5 may be leveled at both the portion A and the portion B by filling the solder resist ink 60 into the recess portion 12 by the preprinting step, so that the generation of difference in film thickness between the portion A and the portion B may be prevented.

What is claimed is:

1. In a process for forming solder lands in a printed wiring board manufacturing method, comprising the steps of forming a wiring circuit of a required pattern of a copper foil on an electrical insulating sheet and printing required solder resists on the wiring circuit, the improvement comprising preprinting solder resist on the printed wiring board, before printing the required solder resists, for leveling the surface of the wiring circuit to provide a flat surface so that the step of printing required solder resists on the wiring circuit can be carried out at a lower printing pressure than would otherwise be possible.

2. A process for forming solder lands in the printed wiring board manufacturing method as claimed in claim 1, wherein the preprinting step comprises filling solder resist ink into recess portions in the surface of the wiring circuit.

3. A process for forming solder lands in the printing wiring board manufacturing method as claimed in claim 1, wherein the preprinting step comprises filling solder resist ink into recess portions in the surface of the wiring circuit through a mask screen corresponding to a pattern opposite to the pattern of the wiring circuit.

4. A process for forming solder lands on a printed circuit board comprising the steps of:
   forming a printed circuit of copper foil conductors on an insulating substrate in a pattern;
   preprinting solder resist to level the surface of the printed circuit board so that a low printing pressure may subsequently be used for printing a desired pattern of solder resist;
   and thereafter printing a desired pattern of solder resist on the leveled surface for forming solder lands on the copper foil conductors.

5. The process according to claim 4, wherein the step of preprinting comprises filling solder resist ink between copper foil conductors to produce a flat surface flush with an upper surface of the copper foil conductors.

6. The process according to claim 4, wherein the step of preprinting comprises applying solder resist ink to the printed circuit board through a mask screen having a pattern opposite to the pattern of the printed circuit to fill in between copper foil conductors and produce a flat surface.

* * * * *